US006864151B2

(12) United States Patent
Yan et al.

(10) Patent No.: US 6,864,151 B2
(45) Date of Patent: Mar. 8, 2005

(54) METHOD OF FORMING SHALLOW TRENCH ISOLATION USING DEEP TRENCH ISOLATION

(75) Inventors: Jiang Yan, Beacon, NY (US); Danny Pak-Chum Shum, Poughkeepsie, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/615,630

(22) Filed: Jul. 9, 2003

(65) Prior Publication Data

US 2005/0009290 A1 Jan. 13, 2005

(51) Int. Cl.[7] .............................................. H01L 21/76
(52) U.S. Cl. ...................... 438/424; 438/401; 438/427; 257/501; 257/520
(58) Field of Search ................................ 438/400–405, 438/424–435, 499; 257/501, 510, 520

(56) References Cited

U.S. PATENT DOCUMENTS

| | | | |
|---|---|---|---|
| 4,994,406 A | 2/1991 | Vasquez et al. | |
| 6,184,107 B1 * | 2/2001 | Divakaruni et al. | 438/427 |
| 6,284,593 B1 * | 9/2001 | Mandelman et al. | 438/248 |
| 6,297,127 B1 | 10/2001 | Chen et al. | |
| 6,667,226 B2 * | 12/2003 | Pinto et al. | 438/524 |

* cited by examiner

*Primary Examiner*—Caridad Everhart
*Assistant Examiner*—Calvin Lee
(74) *Attorney, Agent, or Firm*—Slater & Matsil, L.L.P.

(57) ABSTRACT

A method of isolating active areas of a semiconductor workpiece. Deep trenches are formed in a workpiece between adjacent first active areas, and an insulating layer and a semiconductive material are deposited in the deep trenches. The semiconductive material is recessed below a top surface of the workpiece. Shallow trenches are formed in the workpiece between adjacent second active areas, and an insulating material is deposited in the shallow trenches and in the semiconductive material recess. The deep trenches may also be formed between an adjacent first active area and second active area. The first active areas may be high voltage devices, and the second active areas may be low voltage devices. The shallow trench isolation over the recessed semiconductive material in the deep trenches is self-aligned.

16 Claims, 4 Drawing Sheets

METHOD OF FORMING SHALLOW TRENCH ISOLATION USING DEEP TRENCH ISOLATION

TECHNICAL FIELD

The present invention relates generally to semiconductor devices, and more particularly to a method of forming shallow trench isolation (STI) in semiconductor devices.

BACKGROUND

Semiconductor devices are used in a variety of electronic applications, such as personal computers and cellular phones, for example. One such semiconductor product widely used in electronic systems for storing data is a semiconductor memory device, and one common type of semiconductor memory device is a dynamic random access memory (DRAM). DRAM is volatile memory because it loses charge or "data" in the absence of electrical power.

Another type of semiconductor memory device is a read-only memory (ROM), which is non-volatile because it retains charge or "data" in the absence of electrical power. ROM typically has a similar structure to a DRAM but has no storage capacitor and does not need to be refreshed continuously, as in a DRAM. Common applications for ROM are very broad for its smallest cell size and no extra process cost. However, ROM is one-time programmable (set during processing steps), and does not offer re-programmability. End-users see a ROM device as read-only memory.

A more recent development in ROM is a flash memory device. The term "flash" is derived from the "lightning strike" for fast erase or high voltage that may be used to in-system bulk erase the entire chip or a sector. Flash memories are used often in System-on-Chip (SoC) such as cellular phones and security cards for example, and in mass-storage applications such as in digital cameras and MP3, for example. Flash memories offer the compromise of in-system reprogrammability and somewhat higher process cost or larger cell size, compared to traditional ROM.

A semiconductor memory device typically includes millions or billions of individual memory cells, with each cell storing one bit of data. A memory cell may include an access field effect transistor (FET), often called 2T cell, or use memory cell's own transistor, often called 1T cell, which is used to control the transfer of data charges to and from the storage floating gate (FG) during reading and writing operations. Memory devices are typically arranged in an array of memory cells. The storing and accessing of information into and from memory cells is achieved by selecting and applying voltages to the access FET or directly to the memory cell using selected wordlines and bitlines. Typical flash memories operate with relatively high voltages, e.g. greater than 10 V.

In fabricating semiconductor devices such as SoC, shallow trench isolation (STI) is a technique used to provide electrical isolation between various devices such as logic devices, mixed-signal, analog, as well as adjacent cells in a memory array configuration. In some semiconductor device such as in SoC designs, it is more advantageous to integrate a dual-isolation scheme since some devices need more electrical isolation from adjacent devices than others. When the memory cells comprise high voltage devices such as flash memory cells, for example, the high voltage devices as well as flash memories require deeper isolation regions within the substrate in order to electrically isolate them from adjacent devices, compared to logic devices that require STI for their low voltage operation. It is more difficult to pattern deep isolation regions for higher aspect ratio features (trench depth over its width); therefore it is not feasible to use deep trenches to isolate all active areas of a semiconductor device. Thus, some semiconductor device designs such as flash memories, for example, are required to utilize both deep and shallow isolation regions.

Figure 1:
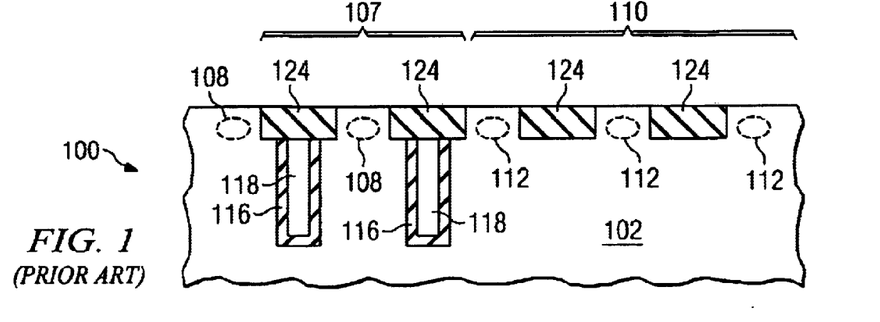
FIG. 1 shows a cross-sectional view of a prior art semiconductor device with both deep isolation structures and shallow isolation structures between active areas.

FIG. 1 illustrates a prior art semiconductor device 100 having deep trenches 116/118/124 for isolation proximate high voltage active areas 108 and shallow trenches 124 for isolation proximate logic (e.g., lower voltage) active areas 112. The semiconductor device 100 shown includes a workpiece 102 having a first region 107 comprising first active areas 108 and a second region 110 having second active areas 112. The first active areas 108 may comprise high voltage transistors or flash memory cells, for example, and thus they require deeper isolation structures 116/118/124 than second active areas 112 which may comprise low voltage devices, for example. The high voltage transistors in the first active areas 108 may require a voltage of 10 to 20 volts or even higher, whereas the low voltage devices in the second active areas 112 may require a voltage of 1 to 2 volts, for example. Thus, such a semiconductor device 100 would require shallow trench isolation 124 between adjacent first active areas 108 and/or second active areas 112, as shown. The high voltage first active areas 108 would also require deep trenches 116/118/124 to prevent electrically affecting the adjacent second active areas 112 and adjacent first active areas 108, if applicable.

Figure 2:
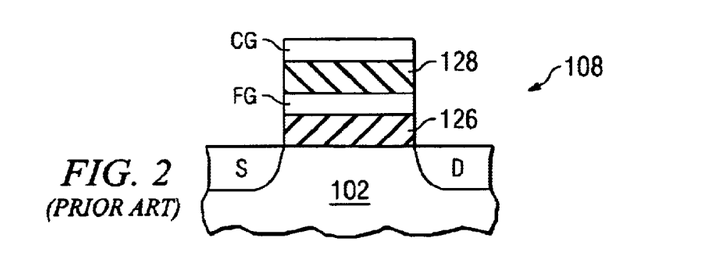
FIG. 2 is a cross-sectional view of a flash memory cell which requires a relatively high voltage.

FIG. 2 shows a first active area 108 comprising a high voltage component having a control gate CG and a floating gate FG. A flash memory device may have a structure shown in first active area 108, for example. The floating gate FG is separated from the substrate 102 or workpiece by a first insulating layer 126. A second insulating layer 128 is disposed between the floating gate FG and the control gate CG. In operation, the control gate CG, source S and drain D are exposed to a high voltage potential in order to charge and discharge the floating gate FG.

SUMMARY OF THE INVENTION

Preferred embodiments of the present invention provide technical advantages by providing a method of forming isolation regions in high voltage active areas and structure for same, as well as forming narrow active areas without an expensive mask scheme or complicated lithographic processes, wherein the shallow isolation regions in a top portion of the deep trenches are self-aligned with the deep trenches.

In accordance with a preferred embodiment of the present invention, a method of forming isolating regions of a semiconductor device includes providing a workpiece, the workpiece having at least one first region and at least one second region, the at least one first region comprising at least one first active area, and the second region comprising areas for at least one second active area. The first region is patterned with at least one first trench, the first trench having sidewalls, a bottom, and a first depth within the workpiece. A first insulating layer is formed over the at least one first trench sidewalls and bottom, and a semiconductive material is deposited or grown in the at least one first trench over the first insulating layer, wherein the semiconductive material is recessed beneath the workpiece top surface. The second region is patterned with at least one second trench, the second trench having a second depth within the workpiece, wherein the second depth is less than the first depth. An insulating material is deposited in the at least one second trench and in the semiconductive material recess of the at least one first trench. At least one second active area is then formed in the second region.

In accordance with another preferred embodiment of the present invention, a method of forming isolating regions of a semiconductor device includes providing a workpiece, the workpiece having at least one first region and at least one second region, the at least one first region comprising at least one high voltage active area, the second region comprising areas for at least one low voltage active area. The first region is patterned with at least one deep trench, the deep trench having sidewalls, a bottom, and a first depth within the workpiece, and a first insulating layer is formed over the at least one deep trench sidewalls and bottom. A semiconductive material is formed in the at least one deep trench over the first insulating layer, wherein the semiconductive material is recessed beneath the workpiece top surface. The at least one first region is masked, and the at least one second region is patterned with at least one shallow trench, the shallow trench having a second depth within the workpiece, wherein the second depth is less than the first depth. The mask is removed from over the at least one first region, an insulating material is deposited in the at least one shallow trench and in the semiconductive material recess of the at least one deep trench, and at least one low voltage active region is formed in the second region.

In accordance with yet another preferred embodiment of the present invention, a semiconductor device includes a workpiece, the workpiece having at least one first region including at least one high voltage active area and at least one second region including at least one low voltage active area. At least one deep trench is disposed within the at least one first region proximate a high voltage active area, the deep trench having sidewalls and a bottom. The deep trench includes a first insulating layer disposed over the sidewalls and bottom and a semiconductive material disposed over the first insulating layer. The semiconductive material is recessed beneath the workpiece top surface and a shallow isolation region is disposed within the semiconductive material recess at the same time the shallow isolation region is formed in the second region. At least one shallow isolation region is disposed within the at least one second region of the workpiece proximate a low voltage active area.

Advantages of preferred embodiments of the present invention include providing a method of self-aligning shallow isolation regions of deep isolation trenches so that the shallow isolation region over the deep trenches does not require patterning using lithography. The fill material of the deep trench is recessed below a top surface of the workpiece, and the recess is filled with insulating material to form a shallow isolation region over a deep isolation trench. Embodiments of the invention eliminate challenges that arise when attempting to overlay deep trenches with shallow trench isolation. Another advantage of embodiments of the present invention is providing a method of forming narrow and long active regions, particularly in the memory portion such as Flash, ROM or DRAM for scaling, without patterning to avoid resist profile constraints such as resist shorting, breaking, or fall-down.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a semiconductor flash memory device. The invention may also be applied, however, to other semiconductor memory device and other semiconductor device applications, for example.

Figure 3:
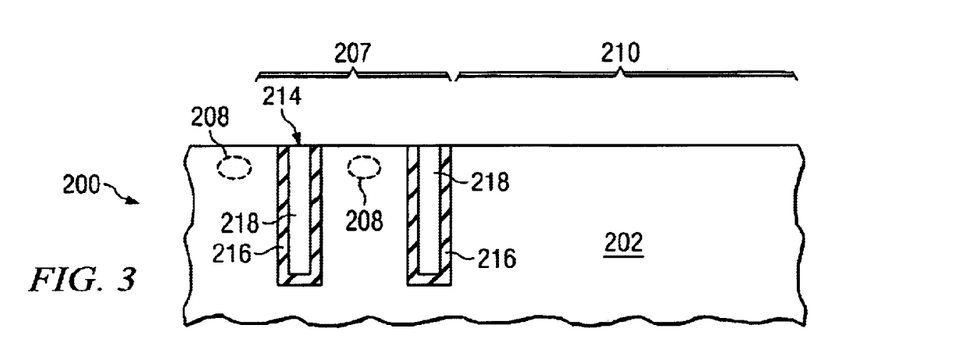
FIGS. 3 through 5 show cross-sectional views of a less-preferred method of forming isolation structures in a semiconductor device, wherein shallow trench isolation regions are aligned using lithography to underlying deep trenches.
Figure 4:
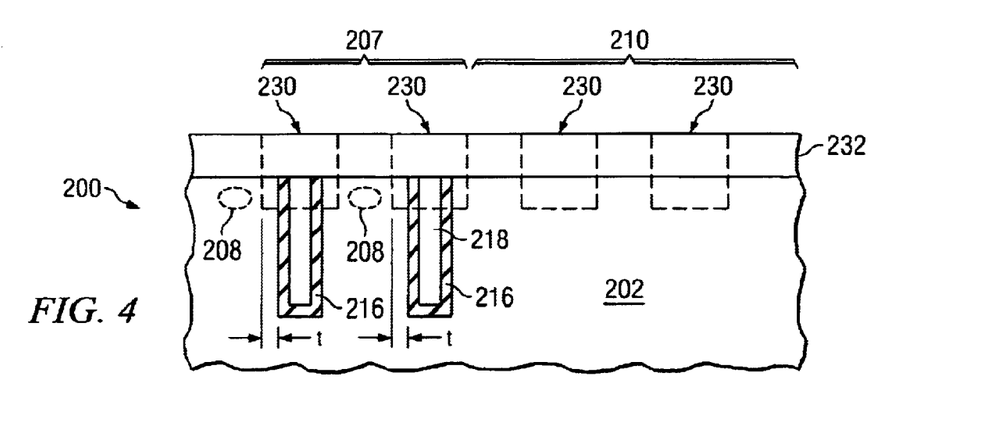
Figure 5:
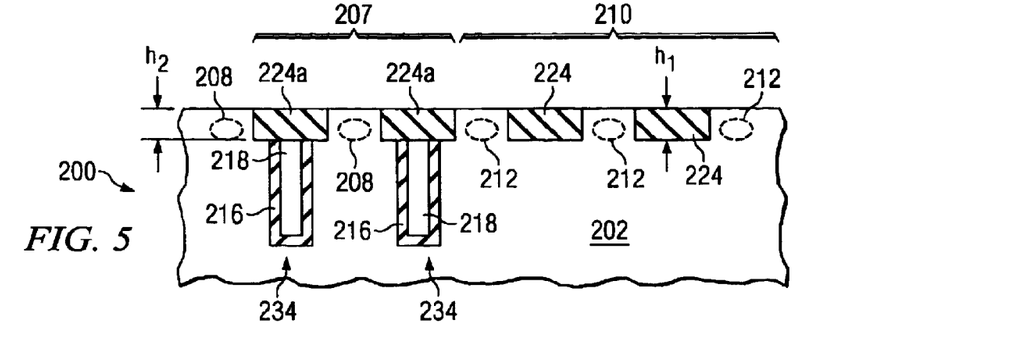

FIGS. 3 through 5 illustrate a potential, less-preferred method that could be used to form isolation regions in a semiconductor device 200 having regions of both high voltage components and low voltage components. Referring first to FIG. 3, a substrate 202 or workpiece is provided, and first active areas 208 are formed within the substrate 202. The first active areas 208 may comprise high voltage components or transistors such as flash memory cells, as shown in FIG. 2, for example. The substrate 202 is patterned with a pattern 214 for at least one deep trench in the first region 207 of the substrate 202. The deep trenches 214 may comprise a depth of 2–3 $\mu$m or more, for example. The deep trenches 214 are formed proximate the first active areas 208 and areas where it is desired to isolate the first active areas 208 from other components such as 208 and 212 that have already been formed in the substrate 202, or alternatively, will later be formed. Next, an insulating layer 216 may be deposited over the patterned deep trenches 214, and a semiconductive material 218 may be deposited over the insulating layer 216 to fill the deep trenches 214.

A photoresist 232 is deposited over the surface of the substrate 202, as shown in FIG. 4. The photoresist 232 is patterned with a pattern 230 for shallow trench isolation in both the first region 207 and the second region 210. The pattern 230 of the photoresist 232 is then transferred to the substrate 202 using lithography. For example, the photoresist 232 may be used as a mask while the substrate 202 is directly etched in both the first region 207 and the second region 210 of the semiconductor device 200. Alternatively the photoresist 232 could be used as a mask while another hard mask, such as a oxide layer (not shown), is etched in both the first region 207 and the second region 210 of the semiconductor device 200, and the hard mask is used as a mask while the substrate 202 is etched in both the first region 207 and the second region 210 of the semiconductor device 200.

The semiconductive material 218 and insulating layer 216 of the deep trenches 214 are removed in the region of the shallow trench isolation pattern 230 in the first region 207. The shallow trench isolation pattern 230 is wider than the deep trench pattern 214. For example, an overlay t of about 50 nm or less may exist on both sides of each deep trench pattern 214.

The photoresist is removed, and an insulating material such as an oxide is deposited over the semiconductor device 200 to fill the shallow trench isolation pattern 230 and form shallow trench isolation regions 224, as shown in FIG. 5. The height $h_1$ of the shallow trench isolation regions 224 and the second region 210 of the semiconductor device is equal to the height $h_2$ of the shallow trench isolation regions 224 in the first region 207 of the semiconductor device because the shallow trench isolation regions 224 are patterned simultaneously for the first and second regions 207/210 of the semiconductor device. The second active areas 212 of the semiconductor device may then be formed within the top surface of substrate 202, as shown.

The method described of forming isolation regions for semiconductor device 200 is problematic because of the small overlay t that exists in the shallow trench isolation pattern 230, which can cause alignment problems. The overlay t is very small and makes it quite difficult to align the shallow trench isolation pattern 230 with the underlying deep trench 234. Another problem is forming narrow and long active regions as required in memory portions of the chip for sealing. Therefore, what is needed in the art is a method and structure for forming deep and shallow isolation structures in semiconductor devices having no alignment problems between the shallow trench isolation and underlying deep trenches, and no lithographic constraints to form narrow and long active regions.

Preferred embodiments of the present invention provide a method of forming isolation regions in semiconductor devices having high voltage components and low voltage components wherein there is no alignment problem between the shallow trench isolation and deep trenches, and no lithographic constraints for forming narrow and long active regions in areas having high voltage components.

Figure 6:
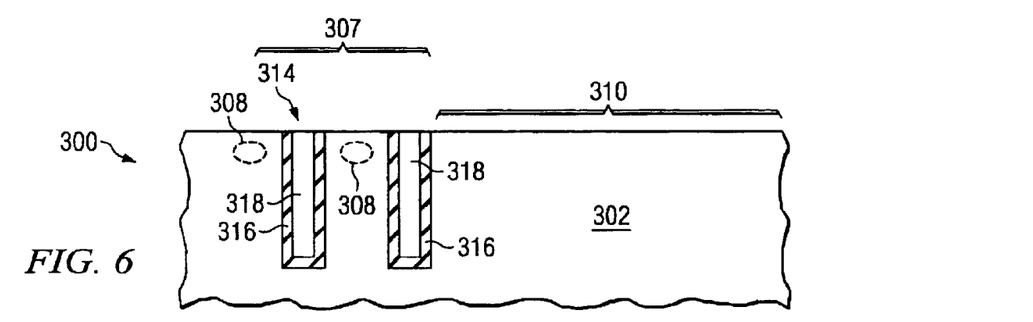
FIGS. 6 through 9 illustrate cross-sectional views of a semiconductor device at various stages of manufacturing, wherein shallow trench isolation regions are automatically aligned with underlying deep trenches in accordance with a preferred embodiment of the present invention.

FIGS. 6 through 9 show cross-sectional views of a semiconductor device 300 at various stages of fabrication in accordance with a preferred embodiment of the present invention. Referring first to FIG. 6, a workpiece 302 is provided. The workpiece 302 may include a semiconductor substrate comprising silicon or other semiconductor materials covered by an insulating layer, for example. The workpiece 302 may also include other active components or circuits formed in the front end of line (FEOL), not shown. The workpiece 302 may comprise silicon oxide over single-crystal silicon, for example. The workpiece 302 may include other conductive layers or other semiconductor elements, e.g. transistors, diodes, etc. Compound semiconductors, GaAs, InP, Si/Ge, or SiC, as examples, may be used in place of silicon.

The workpiece 302 preferably comprises at least one first region 307 and at least one second region 310. The at least one first region 307 is a region of the workpiece 302 in which first active areas 308, which may comprise high voltage devices such as flash memory cells, for example, will be formed. The second region 310 of the workpiece 302 comprises a region where second active areas 312 comprising low voltage devices, e.g., access FET's and other devices requiring a voltage lower than the high voltage devices 308, will later be formed.

First active areas 308 are formed within the workpiece 302. The first active areas 308 may comprise high voltage devices or transistors such as the one shown in FIG. 2. The first active areas 308 may alternatively comprise electrical devices that need increased isolation from other components, for example. Only two first active areas 308 are shown in FIG. 6; however, there may be a plurality of first active areas 308 formed in the at least one first region 307, not shown.

Figure 9:
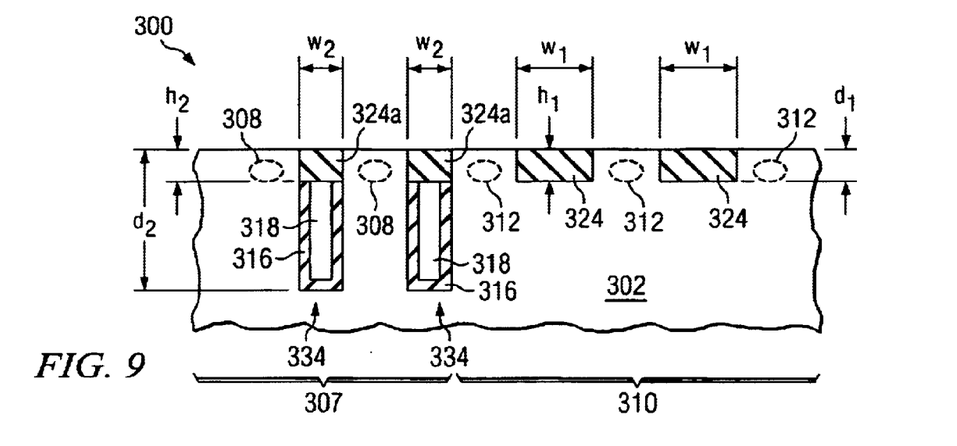

Preferably, second active areas 312 are formed in the workpiece 302 after the formation of deep trenches and shallow trench isolation, as shown in FIG. 9. However, alternatively, second active areas 308 may be formed within the second region 310 of the workpiece 302 at this stage of manufacturing (not shown in FIG. 6).

The workpiece 302 is patterned with a deep trench pattern 314. The deep trench pattern 314 may extend into the top surface of the workpiece by a depth of 2–3 $\mu$M or more, for example. Alternatively, the deep trench pattern 314 may comprise other depths, such as 1 to 6 $\mu$m, for example.

An insulating layer 316 is formed over the patterned deep trenches 314. The insulating layer 316 may comprise a thin oxide or nitride layer comprising 50 to 200 Angstroms of an oxide or silicon nitride, for example. In case the insulating layer 316 comprises a nitride layer, it may also further comprise a thin oxide layer formed over the thin nitride layer. The thin oxide layer may be formed by an oxidation step at a temperature of 900 to 1000 degrees C. for approximately 10 to 30 seconds, for example. The final insulating layer 316 thickness is preferably approximately 10 nm, as an example. The insulating layer 316 electrically isolates the workpiece 302 from the semiconductive material 318 that will be deposited.

A semiconductive material 318 is then deposited over the semiconductor device to fill the deep trenches 314. The semiconductive material 318 may also cover the top surface of the workpiece 302, not shown. The semiconductive material 318 preferably comprises a doped or undoped semiconductor material, such as doped polysilicon or undoped polysilicon, as examples. Alternatively, the semiconductive material 318 may comprise other semiconductive materials, for example.

Figure 7:
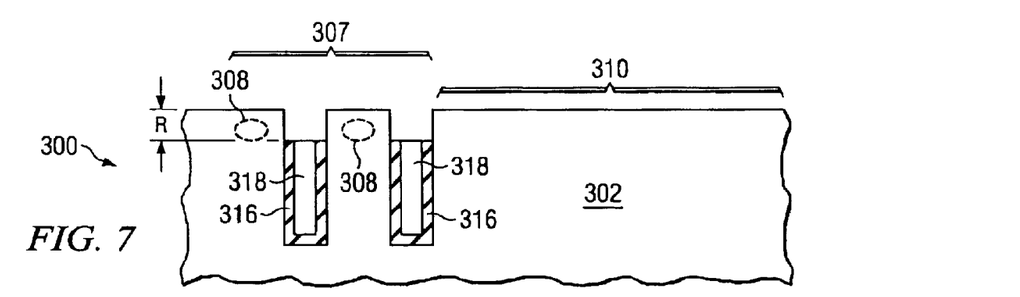

The semiconductive material 318 is then recessed below the top surface of the workpiece 302 by an amount R. The semiconductive material 318 may be recessed using a dry etch, for example, although other etch processes may alternatively be used to recess the semiconductive material 318. The recess R comprises a depth of approximately 300 nm, for example, although alternatively, the recess R may range from 200 to 600 nm, as examples.

Figure 8:
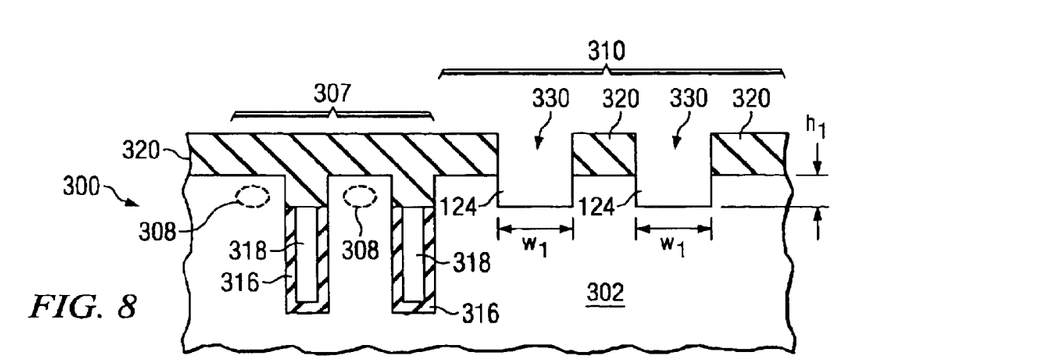

A hard mask 320 is deposited over the top surface of the workpiece 302 and over the recessed semiconductive material 318 and exposed insulating layer 316, as shown in FIG. 8. The hard mask 320 may comprise an insulator such as tetraethoxysilate (TEOS), as an example. The hard mask 320 may comprise a thickness of 100 nm, as an example. The hard mask 320 may alternatively comprise other oxides or nitrides, and may alternatively comprise a thickness of 50 nm to 250 nm, as examples.

The hard mask 320 is patterned with the pattern 330 for shallow trench isolation regions in the second region 310. In accordance with preferred embodiments of the present invention, the first region 307 is preferably not patterned with the shallow trench isolation pattern 330. Rather, the recess R of the deep trench semiconductive material 318 below the top surface of the workpiece 302 provides an area for the formation of a shallow trench isolation region 324a that is self-aligned with the underlying deep trench material, to be described further herein.

The hard mask 320 is used as a mask to pattern the underlying workpiece 302 in the second region 310 with the shallow trench isolation pattern 330, as shown in FIG. 8. The shallow trenches 330 formed preferably have a height $h_1$ (or $d_1$ in FIG. 9) of approximately 300 to 500 nm within the workpiece 302, for example. The shallow trenches 330 have a width $w_1$.

After patterning the workpiece 302 with the shallow trench isolation pattern 330, a portion of the hard mask 320, e.g., 400 Angstroms, may remain over the workpiece 302. The remaining hard mask 320 is removed, using a wet etch or another etch process, as examples, as shown in FIG. 9. An insulating material 324/324a is deposited over the top surface of the workpiece 302 to fill the shallow trench isolation pattern 330 in the second region 310, and to also fill the recess R above the semiconductive material 318 and insulating layer 316 in the first region 307. The insulating material 324/324a preferably comprises silicon dioxide and may comprise, for example, high density plasma (HDP) silicon dioxide, as examples. The insulating material 324/324a may alternatively comprise other insulators such as a nitride or other insulators, for example. The insulating material 324/324a forms shallow isolation trenches 324a in the first region 307 and shallow isolation trenches 324 in the second region 310.

In one embodiment, the width $w_1$ of the shallow isolation trenches 324 is greater than the width $w_2$ of the deep trenches 334 and shallow isolation trenches 324a over the deep trenches 334, as shown in FIG. 9. Also, in one embodiment, the height $h_1$ of the shallow isolation trenches 324 is equal to the height $h_2$ of the shallow isolation trench regions 324a disposed over the deep trenches 316 and 318. Alternatively, in other embodiments, the height $h_1$ of the shallow isolation trenches 324 may be less than the height $h_2$ of the shallow isolation trench regions 324a disposed over the deep trenches 316 and 318, or height $h_1$ of the shallow isolation trenches 324 may be greater than the height $h_2$ of the shallow isolation trench regions 324a disposed over the deep trenches 316 and 318, as examples.

Further processing of the semiconductor device is continued. For example, second active areas 312 comprising low voltage devices, for example, may then be formed within the top surface of the workpiece 302 in the second region 310, as shown in FIG. 9.

Advantageously, in accordance with embodiments of the present invention, the shallow trench isolation 324a disposed over the deep trenches 334 in the first region 307 of the semiconductor device 308 are self-aligned with the underlying deep trenches 334. Thus, there is no need to pattern the first region 307 with the shallow trench isolation pattern 330, and alignment problems and concerns with underlying deep trenches 334 are eliminated.

Figure 10:
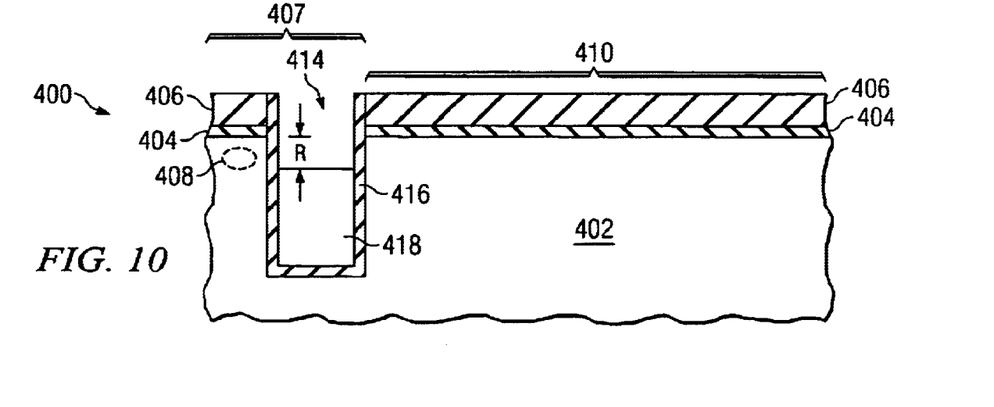
FIGS. 10 through 14 illustrate cross-sectional views of a semiconductor device at various stages of manufacturing in accordance with another preferred embodiment of the present invention.

FIGS. 10 through 14 illustrate cross-sectional views of a semiconductor device 400 in various stages of manufacturing in accordance with another embodiment of the present invention. Referring to FIG. 10, a workpiece 402 is provided. The workpiece 402 preferably comprises a p-type non-epitaxial substrate, for example, although alternatively, the workpiece 402 may comprise other semiconductive materials, as described with reference to the embodiment shown in FIGS. 6 through 9.

A pad oxide 404 is formed over the workpiece 402. The pad oxide 404 preferably comprises approximately 50 Angstroms of silicon dioxide, for example. A pad nitride 406 is deposited over the pad oxide 404. The pad nitride preferably comprises silicon nitride deposited in a thickness of approximately 1800 Angstroms, for example, although alternatively, the pad nitride 406 may comprise other nitride materials and thickness.

A hard mask (not shown) is deposited over the pad nitride 406. The hard mask may comprise boron silicate glass (BSG) deposited in a thickness of approximately 5,000 Angstroms, as an example. Alternatively, the hard mask may comprise other materials and thicknesses. The hard mask is patterned with a deep trench pattern 414. The deep trench pattern 414 may comprise deep trenches that will be formed between adjacent high voltage active areas 408, or between adjacent high voltage active areas 408 and low voltage active areas 412 (see FIG. 14).

The deep trench pattern 414 from the hard mask is transferred to the pad nitride 406, pad oxide 404, and workpiece 402, as shown in FIG. 10. The etchant gases may be changed during the patterning process to pattern the various material layers 406, 404 and 402, for example. The hard mask is removed using a wet etch or other type of etch process.

An insulating layer 416 is formed over the sidewalls and bottoms of the deep trenches 414 formed within the workpiece 402, pad oxide 404 and pad nitride 406. The insulating layer 416 preferably comprises an oxide or thin nitride layer comprising approximately 50 to 200 Angstroms of oxide or silicon nitride. Alternatively, the thin nitride layer may comprise other nitrides formed over the deep trench 414 sidewalls and bottom surface, for example. In case the insulating layer 416 comprises a nitride layer, it may also comprise a thin oxide layer formed over the thin nitride layer. The thin oxide layer may be formed by an oxidation step at a temperature of 900 to 1000 degrees C. for approximately 10 to 30 seconds, as an example. The thickness of the final insulating layer 416 is preferably approximately 10 mm, as an example.

A semiconductive material 418 is deposited over the semiconductor device 400. The semiconductive material 418 fills the deep trench pattern 414 over the insulating layer 416 and also covers the top surface of the pad nitride 406, not shown. The semiconductive material 418 preferably comprises doped or undoped polysilicon, as an example. The semiconductive material 418 may alternatively comprise other semiconductor materials, as an example.

The semiconductive material 418 is removed from the top surface of the pad nitride 406 and is recessed by an amount R beneath the top surface of the workpiece 402. The total depth of the recess below the top surface of the pad nitride 406 preferably comprises approximately 300 nm, for example. The semiconductive material 418 is preferably recessed using a dry etch, for example, although alternatively, other etch processes may be used.

Figure 11:
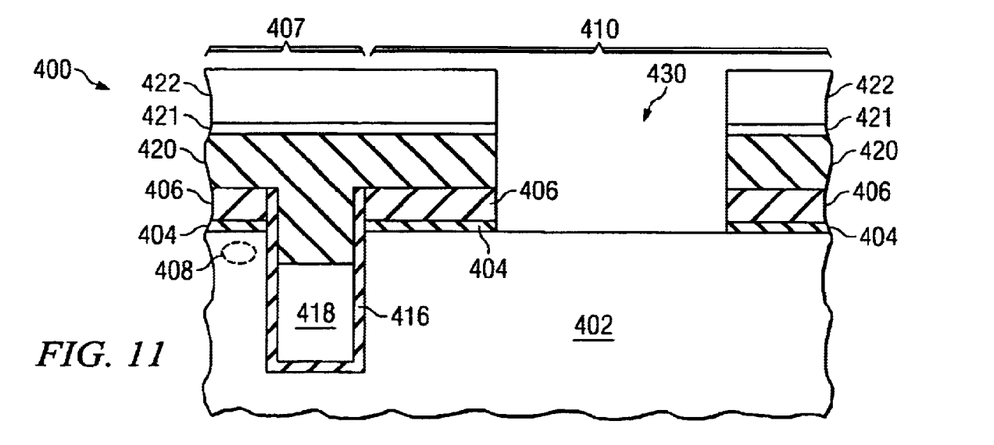

After the deep trench pattern 414 has been formed and partially filled in the first region 407 of the semiconductor device 400, next, shallow trench isolation regions 430 are formed in the second region 412. First, a hard mask 420 is deposited over the pad nitride 406, recessed semiconductive material 418 and exposed portions of the insulating layer 416, as shown in FIG. 11. The hard mask 420 fills the recess in the deep trench over the semiconductive material 418, as shown. The hard mask preferably comprises TEOS deposited in a thickness of approximately 100 nm, as an example. Alternatively, the hard mask 420 may comprise other insulating materials and thicknesses, for example.

An anti-reflective coating (ARC) 421 is deposited over the hard mask 420. A photoresist 422 is deposited over the ARC 421. The ARC 421 may comprise deep ultra-violet (DUV) 90 run ARC, and the photoresist 422 may comprise 625 run resist, as examples. Alternatively, other ARC materials and photoresist materials may be used.

The photoresist 422 is patterned with the shallow trench isolation pattern 430. The ARC 421 and hard mask 420 are opened, or patterned, with the shallow trench isolation pattern 430 of the photoresist 422. Using the photoresist 422 as a mask, the pad nitride 406 and the pad oxide 404 are also patterned with the shallow trench isolation pattern 430, as shown in FIG. 11.

Figure 12:
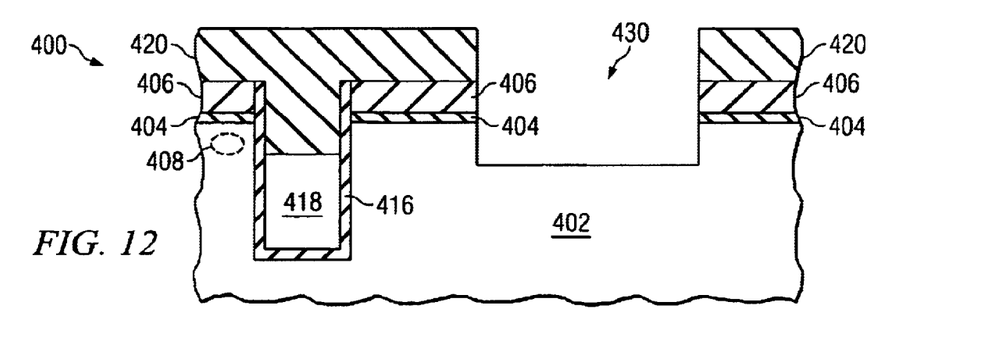

The photoresist 422 and ARC 421 are removed, as shown in FIG. 12. The pattern 430 for the shallow trench isolation of the hard mask 420 is transferred to the workpiece 402 using a reactive ion etch (RIE), for example, although alternatively, other etch processes may be used to pattern the workpiece 402.

Figure 13:
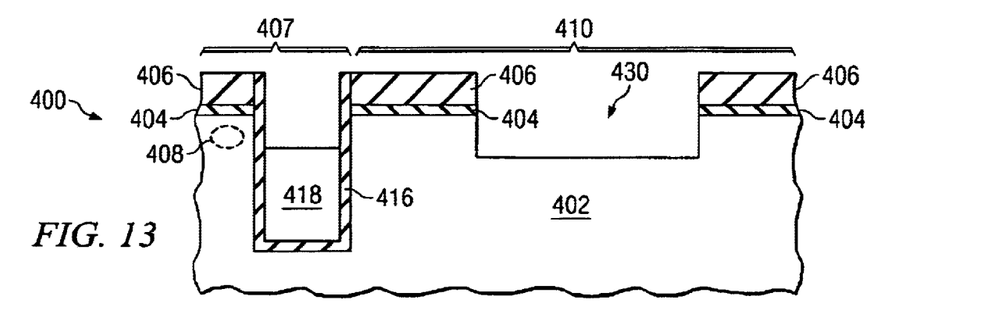

The hard mask 420 is removed, as shown in FIG. 13. The recess above the deep trench in the first region 407 is left exposed, along with the shallow trench isolation region pattern 430 and the second region 410 of the semiconductor device 400. The pad nitride 406 is pulled back: the top edge surfaces are angled slightly as shown, for example, by approximately 100 to 200 Angstroms to obtain a better fill in the subsequent insulating layer deposition.

Figure 14:
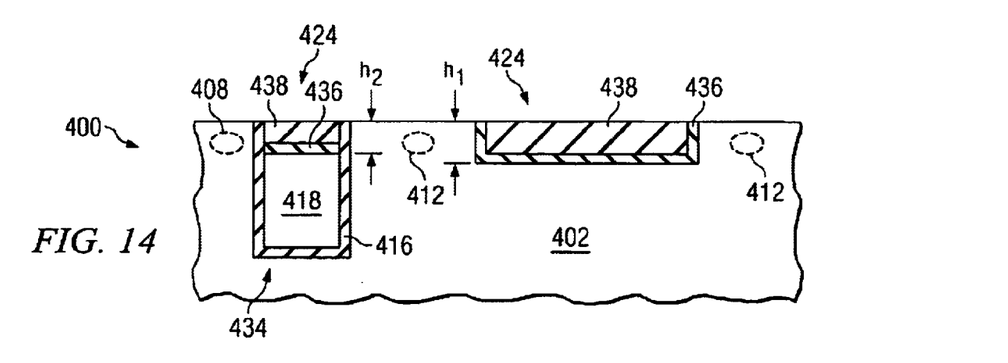

A thin insulating layer 436 is formed over the bottom surface and sidewalls of the shallow trench isolation pattern 430, as shown in FIG. 14. The thin insulating layer 436 preferably comprises a thin layer of silicon dioxide, for example, formed in a thickness of about 13 run, and a thin nitride layer disposed over the thin silicon dioxide layer. The thin nitride layer preferably comprises 50 to 100 Angstroms of silicon nitride, for example. The thin insulating layer 436 is preferably also formed over the top surface of the semiconductive material 418 within the deep trench 434, for example, as shown. The thin insulating layer 436 may also reside over the sidewalls of the deep trench over the insulating layer 416, not shown.

An insulating material 438 is deposited over the pad nitride 406 and exposed surfaces of the workpiece 402, pad oxide 404, insulating layer 416, and semiconductive material 418. The insulating material 438 is then removed from the top surface of the pad nitride 406. The insulating material 438 preferably comprises silicon dioxide, and may comprise, for example, HDP silicon dioxide. Alternatively, the insulating material 438 may comprise other dielectric materials or insulators, for example. The excess insulating material 438 may be removed from the top surface of the pad nitride 406 using a chemical mechanical polish (CMP) process, for example. The pad nitride 406 and pad oxide 404 are also removed from above the top surface of the workpiece 402, leaving the structure 400 shown in FIG. 14.

Subsequent processing is then performed on the semiconductor device 400. For example, second active regions 412 comprising low voltage devices, for example, may be formed within the second region 410 of the semiconductor device 400, as shown. The height $h_1$ of the shallow trench isolation region 424 which comprises thin insulating layer 436 and insulating material 438 in the second region 410 preferably in one embodiment comprises a greater height than the height $h_2$ of the shallow trench isolation 424 formed over the deep trench 434 than the first region 407 of the semiconductor device 400. However, alternatively, in other embodiments, the height $h_1$ may be equal to $h_2$, and alternatively, the height $h_1$ may be less than the height $h_2$.

Advantages of embodiments of the invention include providing a method of self-aligning shallow isolation regions of deep isolation trenches so that the shallow isolation region over the deep trenches does not require patterning using lithography. The fill material of the deep trench is recessed below a top surface of the workpiece, and the recess is filled with insulating material to form a shallow isolation region over a deep isolation trench. Embodiments of the invention eliminate challenges that arise when attempting to overlay deep trenches with shallow trench isolation. Another advantage includes providing a method of forming narrow and long active regions, particularly in the memory portion such as Flash, ROM or DRAM for scaling, without patterning to avoid resist profile constraints such as resist shorting, breaking, or fall-down.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming isolating regions of a semiconductor device, the method comprising:

providing a workpiece, the workpiece having at least one first region and at least one second region, the workpiece having a top surface;

forming at least one first active area in said at least one first region;

patterning the first region with at least one first trench after said step of forming said first active area, the first trench having sidewalls, a bottom, and a first width and a first depth within the workpiece;

forming a first insulating layer over the at least one first trench sidewalls and bottom;

depositing a semiconductive material in the at least one first trench over the first insulating layer;

depositing a photo resist for patterning shallow second trenches over said first and second regions of said substrate;

patterning both said first and second regions, each region patterned with at least one second trench, the second trench having a second depth within the workpiece, that is less than the first depth and a second width or than said first width, said second trenches in said first region being located over said first trenches so as to recess said first insulating layer adding semiconductor material in said first trenches;

depositing an insulating material in the at least one second trench and in the semiconductive material recess of the at least one first trench; and then forming at least one second active area in the second region.

2. The method according to claim 1, wherein the at least one first active area comprises at least one high voltage device, and wherein the at least one second active area comprise at least one low voltage device.

3. The method according to claim 1, wherein depositing a semiconductive material comprises depositing doped polysilicon or undoped polysilicon, wherein forming the insulating layer over the at least one first trench sidewalls and bottom comprises:

forming a thin nitride layer over the at least one first trench sidewalls and bottom; and forming a thin oxide layer over the thin nitride layer.

4. The method according to claim 1, further comprising, before depositing an insulating material in the at least one second trench and in the semiconductive material recess of the at least one first trench, depositing a second insulating layer over the at least one second trench and over the semiconductive material recess of the at least one first trench.

5. The method according to claim 4, wherein depositing the second insulating layer comprises:

forming a thin silicon dioxide layer over the at least one second trench and over the semiconductive material recess of the at least one first trench; and forming a thin silicon nitride layer over the thin silicon dioxide layer.

6. A method of forming isolating regions of a semiconductor device, the method comprising:

providing a workpiece, the workpiece having at least one first region and at least one second region, the workpiece having a top surface;

forming at least one high voltage active area in said at least one first region:

patterning the first region with at least one deep trench after forming said at least one high voltage active area, the deep trench having a first width, sidewalls, a bottom, and a first depth within the workpiece;

forming a first insulating layer over the at least one deep trench sidewalls and bottom;

depositing a semiconductive material in the at least one deep trench over the first insulating layer;

recessing said semiconductive material beneath the workpiece top surface;

forming a bard mask having portions over said at least one first region and over said at least one second region;

patterning the portion of said hard mask over said at least one second region and transferring said hard mask pattern to burn at least one shallow trench in said second region and leaving the portion of said hard mask over said first region in place such that said first region is not further patterned, the shallow trench having a second depth and a second width within the workpiece, wherein the second depth is less than the first depth and the second width is greater than said first width;

removing any remaining hard mask from over at least one first region and said at least one second region;

depositing an insulating material in the at least one shallow trench and in the semiconductive material recess of the at least one deep trench; and forming at least one low voltage active region in the second region.

7. The method according to claim 6, wherein depositing an insulating material in the semiconductive material recess of the at least one deep trench comprises forming shallow trench isolation over the deep trenches.

8. The method according to claim 6, wherein depositing the semiconductive material comprises depositing doped polysilicon or undoped polysilicon, wherein forming the insulating layer over the at least one deep trench sidewalls and bottom comprises:

forming a thin nitride layer over the at least one deep trench sidewalls and bottom; and forming a thin oxide layer over the thin nitride layer.

9. The method according to claim 6, further comprising, before depositing an insulating material in the at least one shallow trench and in the semiconductive material recess of the at least one deep trench, depositing a second insulating layer over the at least one shallow trench and over the semiconductive material recess of the at least one deep trench.

10. The method according to claim 9, wherein depositing the second insulating layer comprises:

forming a thin oxide layer over the at least one shallow trench and over the semiconductive material recess of the at least one deep trench; and forming a thin nitride layer over the thin silicon dioxide layer.

11. The method according to claim 6, wherein patterning the first region with at least one deep trench comprises:

depositing a hard mask over the workpiece top surface;

patterning the hard mask with the deep trench pattern;

patterning the workpiece using the hard mask as a mask; and removing the hard mask.

12. The method according to claim 11, wherein depositing the hard mask comprises depositing Boron-doped Silicon Glass (BSG).

13. The method according to claim 6, wherein said steps of forming a hard mask region and patterning the hard mask over said at least one second region with at least one shallow trench comprising the steps of:

depositing a photoresist over the hard mask;

patterning the photoresist with the at least one shallow trench pattern;

patterning the hard mask with the photoresist pattern;

removing the photoresist;

patterning the workpiece using the hard mask as a mask; and removing the hard mask.

14. The method according to claim 13, wherein depositing the hard mask comprises depositing high density plasma (HDP) silicon dioxide.

15. The method according to claim 6 wherein said at least one low voltage active region in the second region is formed after said insulating material is deposited in the at least one shallow trench and the at least one deep trench.

16. The method according to claim 6 wherein said at least one low voltage region in the second region is formed prior to said step of patterning the first region with at least one deep trench.

* * * * *

UNITED STATES PATENT AND TRADEMARK OFFICE
CERTIFICATE OF CORRECTION

PATENT NO.    : 6,864,151 B2
DATED         : March 8, 2005
INVENTOR(S)   : Yan et al.

It is certified that error appears in the above-identified patent and that said Letters Patent is hereby corrected as shown below:

Column 11,
Line 4, delete "or" and insert -- greater --.
Line 55, delete "bard" and insert -- hard --.

Signed and Sealed this

Seventh Day of June, 2005

JON W. DUDAS
*Director of the United States Patent and Trademark Office*